(12) United States Patent
Caneau et al.

(10) Patent No.: US 9,385,509 B2
(45) Date of Patent: Jul. 5, 2016

(54) MONOLITHIC WIDE WAVELENGTH TUNABLE MID-IR LASER SOURCES

(71) Applicant: Thorlabs Quantum Electronics, Inc., Jessup, MD (US)

(72) Inventors: Catherine Genevieve Caneau, Corning, NY (US); Lawrence Charles Hughes, Jr., Corning, NY (US); Feng Xie, Painted Post, NY (US); Chung-En Zah, Holmdel, NJ (US)

(73) Assignee: Thorlabs Quantum Electronics, Inc., Jessup, MD (US)

( * ) Notice: Subject to any disclaimer, the term of this patent is extended or adjusted under 35 U.S.C. 154(b) by 0 days.

(21) Appl. No.: 14/725,692

(22) Filed: May 29, 2015

(65) Prior Publication Data

US 2015/0270685 A1 Sep. 24, 2015

Related U.S. Application Data

(63) Continuation of application No. PCT/US2013/071971, filed on Nov. 26, 2013.

(60) Provisional application No. 61/731,831, filed on Nov. 30, 2012.

(51) Int. Cl.
*H01S 3/10* (2006.01)
*H01S 5/34* (2006.01)
(Continued)

(52) U.S. Cl.
CPC ............ *H01S 5/3402* (2013.01); *B82Y 20/00* (2013.01); *H01S 3/1055* (2013.01);
(Continued)

(58) Field of Classification Search
CPC ... H01S 5/3402; H01S 3/1055; H01S 5/0014; H01S 5/028; H01S 5/0612; H01S 5/06256; H01S 5/06258; H01S 5/1218; H01S 5/1228; H01S 5/3401; H01S 5/4087; H01S 5/0687; H01S 5/1096; H01S 5/4043; B82Y 20/00
USPC .......................................................... 372/20
See application file for complete search history.

(56) References Cited

U.S. PATENT DOCUMENTS

| | | | |
|---|---|---|---|
| 6,091,751 A | | 7/2000 | Berger |
| 6,101,014 A | * | 8/2000 | Majima ............... H04J 14/0224 398/1 |

(Continued)

FOREIGN PATENT DOCUMENTS

| | | |
|---|---|---|
| EP | 0863589 A1 | 9/1998 |
| WO | 2012021333 A2 | 2/2012 |

OTHER PUBLICATIONS

Benjamin, "Broadband Distributed-Feedback Quantum Cascade Laser Array Operating From 8.0 to 9.8 μm", IEEE Photonics Technology Letters, vol. 21, No. 13, Jul. 1, 2009.*

(Continued)

*Primary Examiner* — Jessica Stultz
*Assistant Examiner* — Vu A Vu
(74) *Attorney, Agent, or Firm* — Graham Curtin, P.A.

(57) ABSTRACT

A monolithic tunable mid-infrared laser has a wavelength range within the range of 3-14 μm and comprises a heterogeneous quantum cascade active region together with at least a first integrated grating. The heterogeneous quantum cascade active region comprises at least one stack, the stack comprising two, desirably at least three differing stages. Methods of operating and calibrating the laser are also disclosed.

20 Claims, 10 Drawing Sheets

(51) Int. Cl.
*H01S 5/028* (2006.01)
*H01S 5/06* (2006.01)
*H01S 5/0625* (2006.01)
*H01S 5/12* (2006.01)
*B82Y 20/00* (2011.01)
*H01S 3/1055* (2006.01)
*H01S 5/00* (2006.01)
H01S 5/0687 (2006.01)
H01S 5/10 (2006.01)
H01S 5/40 (2006.01)

(52) U.S. Cl.
CPC .............. *H01S 5/0014* (2013.01); *H01S 5/028* (2013.01); *H01S 5/0612* (2013.01); *H01S 5/06256* (2013.01); *H01S 5/06258* (2013.01); *H01S 5/1218* (2013.01); *H01S 5/1228* (2013.01); *H01S 5/3401* (2013.01); *H01S 5/4087* (2013.01); *H01S 5/0687* (2013.01); *H01S 5/1096* (2013.01); *H01S 5/4043* (2013.01)

(56) References Cited

U.S. PATENT DOCUMENTS

| | | | | |
|---|---|---|---|---|
| 7,924,893 B2* | 4/2011 | Farrell | ................ | H01S 5/0687 372/20 |
| 7,994,479 B2* | 8/2011 | Weidmann | ................ | G01J 3/02 250/343 |
| 2003/0161631 A1* | 8/2003 | Margalit | .......... | H04B 10/07955 398/33 |
| 2003/0219054 A1* | 11/2003 | Capasso | ................ | B82Y 20/00 372/50.22 |
| 2010/0309942 A1 | 12/2010 | Belkin | | |
| 2012/0033697 A1* | 2/2012 | Goyal | ................ | B82Y 20/00 372/45.01 |
| 2012/0051386 A1* | 3/2012 | Kim | ...... | H01S 5/1096 372/96 |
| 2012/0230359 A1* | 9/2012 | Kato | ...... | B82Y 20/00 372/45.01 |
| 2013/0114628 A1* | 5/2013 | Caneau | ................ | B82Y 20/00 372/20 |
| 2013/0136148 A1 | 5/2013 | Caneau et al. | | |

OTHER PUBLICATIONS

Mansuripur "Widely tunable mid-infrared quantum cascade lasers using sampled grating reflectors", Optical Society of America, Oct. 2012 / vol. 20, No. 21 / Optics Express.*

International Search Report and Written Opinion mailed May 15, 2014 in corresponding International Application No. PCT/US2013/071971.

Straub, A., et al.; "Two-Wavelength Quantum Cascade Lasers with Heterogeneouscascades," Optoelectronic and Microelectronic Materials and Devices, 2002 IEEE Conference; Dec. 11, 2002; pp. 141-144, Piscataway, NJ, US; XP010662258.

Abdou Diba, et al.; "Wavelength Tuning of Sampled-Grating DBR Quantum Cascade Lasers," Lasers and Electro-Optics (CLEO), 2012 IEEE Conference; May 6, 2012; pp. 1-2; San Jose, CA, US; XP032245925.

Arash Sadeghi, et al.; "Post-fabrication wavelength selection and spectral narrowing of Quantum Cascade lasers via application of a shallow distributed Bragg reflector," Lasers and Electro-Optics (CLEO), 2012 IEEE Conference; May 6, 2012; pp. 1-2; San Jose, CA, US; XP032245926.

* cited by examiner

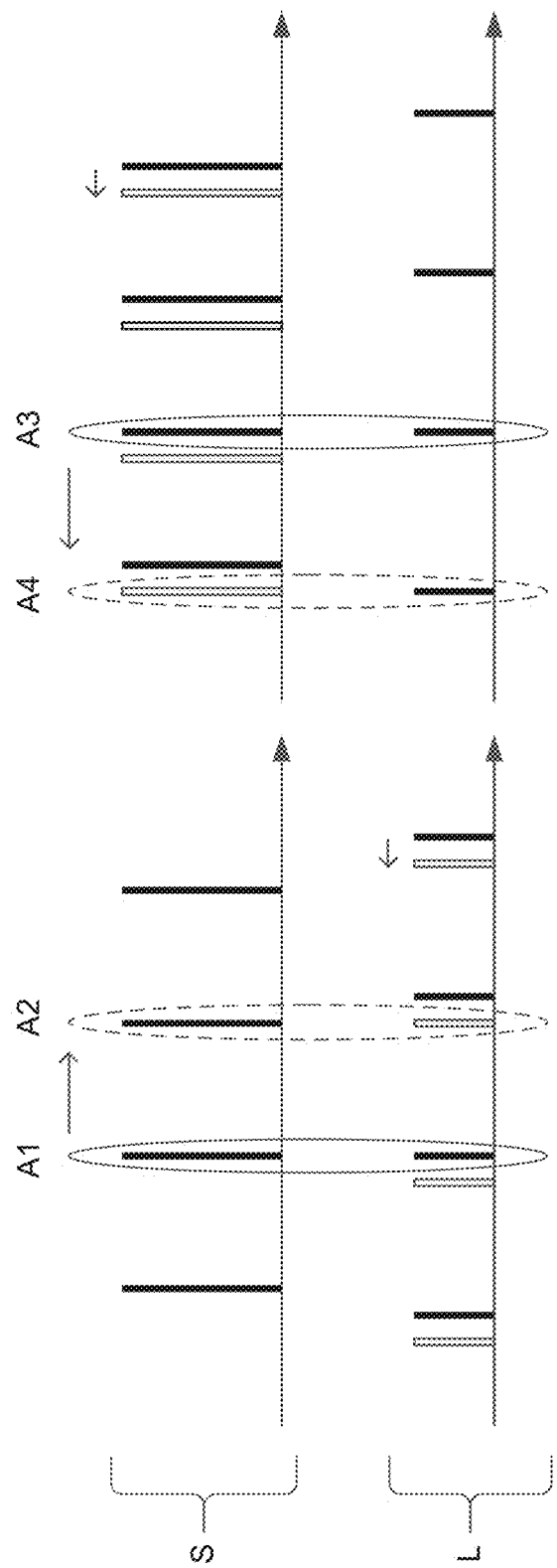

MONOLITHIC WIDE WAVELENGTH TUNABLE MID-IR LASER SOURCES

CROSS-REFERENCE TO RELATED APPLICATIONS

This application is a continuation of International Application No. PCT/US2013/071971 filed on Nov. 26, 2013, which claims priority to U.S. Patent Application No. 61/731,831 filed on Nov. 30, 2012, the contents of each of which are incorporated herein by reference.

FIELD

The present specification generally relates to semiconductor-based lasers and, more specifically, to distributed Bragg reflector (DBR) lasers in the mid-infrared region that have an active core comprising heterogeneous cascaded stages providing broad-band amplification with integrated grating-based tuning capability providing a continuum of available wavelengths, desirably over a large wavelength range (for example, as much as 20, 30, 40, or 50% of center wavelength). Methods of making such devices are also disclosed.

TECHNICAL BACKGROUND

Strong absorption lines in the mid-IR region from the vibration of chemical bonds can be used to identify important molecules. Mid-IR wavelength-tunable sources like distributed-feedback (DFB) quantum-cascade lasers (QCLs) or wavelength tunable external-cavity (EC) QCLs may be used to scan the wavelength around an absorption line. DFB QCLs are often used to detect a selected narrow absorption peak, such as the major absorption peak of a particular small molecule, for example, the absorption peak of $CO_2$ near a wavenumber of 2350 $cm^{-1}$ (4.2-4.3 μm) on the horizontal axis, shown on a y axis of line intensity $(cm^{-1})/(molecule\ cm^{-2})$ in the graph of FIG. 1. Existing EC-QCLs generally have a significantly larger wavelength tuning range of around 100 and even up to 500 $cm^{-1}$ and may be used to detect the broader characteristic absorption profile of a large molecule. One previously proposed example is the detection of the absorption profile from 950-1200 $cm^{-1}$ of glucose, as shown in the graph of FIG. 2 (see, e.g., M. Brandstetter, A. Genner, K. Anic and B. Lendl, "Tunable external cavity quantum cascade laser for the simultaneous determination of glucose and lactate in aqueous phase," The Royal Society of Chemistry, 2010), with traces showing absorbance as a function of wavenumber for 300, 200 and 100 mg/dl glucose concentrations, downward from the top trace, respectively. Another example of interest is the detection of the mid-IR absorption profiles characteristic of common explosive materials. Using an external cavity QCL, Fuchs et al. demonstrated the capability to detect quantities of explosives like PETN, TNT, RDX, and SEMTEX with sensitivity 20 μg/$cm^2$ at distances up to 25 m. (See F. Fuchs, S. Huggera, M. Kinzera, Q. K. Yanga, W. Bronnera, R. Aidama, K. Degreifb, S. Rademacherb, F. Schnürerc, and W. Schweikertc, "Standoff detection of explosives with broad band tunable external cavity quantum cascade lasers," Proc. of SPIE vol. 8268, 82681N-1-9, 2012.) The graph of FIG. 3 shows absorbance as a function of wavelength in micrometers for PETN (102), RDX (104), TATP (106), and TNT (108), together with one example of a wavelength range R of interest for used in detecting these and other substances.

EC QCLs typically offer a wide tuning range, but are larger and more expensive to fabricate and maintain than DFB QCLs and are relatively slow to tune to a given frequency with typical tuning time in the millisecond range. DFB QCLs typically are smaller, less expensive to manufacture and maintain, and typically allow for the emission of stable, narrow wavelengths that are very quickly tunable, in typically very narrow ranges, with tuning time in the microsecond range. Realization of readily manufacturable widely tunable QCLs such as DBR lasers with superstructure grating has been lacking, however, preventing their economical application in sensing larger molecules such as those with absorption profiles like the ones depicted in FIGS. 2 and 3 above. It would be advantageous in various fields, if the low cost, relative efficiency, quick-tuning and other beneficial properties of superstructure grating DBR QCL lasers could be readily and practically utilized across a broad range of wavelengths.

SUMMARY

A monolithic tunable mid-infrared laser is disclosed having a wavelength range within the range of 3-14 μm and comprises a heterogeneous quantum cascade active region together with at least a first integrated grating. The heterogeneous quantum cascade active region comprises at least one stack, the stack comprising at least two, desirably three or more stages. Desirably, a Bragg wavelength of the first integrated grating is tunable, in one alternative embodiment, by a microheater. Current injection may also be employed. The laser also desirably comprises a second tunable integrated grating independently tunable from the first grating, and the first and second gratings are desirably comb gratings with respective non-identical first and second comb spacings. Desirably, the first and second integrated gratings are each independently tunable through a range at least equal to a larger spacing of the respective first and second comb spacings.

The gratings may comprise a sampled grating, desirably interleaved sampled grating or other even more complex superstructure gratings as optimized by simulation or other process.

These and other features and advantages will be apparent from the specification and the drawings to those of skill in the art.

BRIEF DESCRIPTION OF DRAWINGS

FIGS. 9A and 9B. Illustration of Vernier-based tuning with comb-type grating reflectors.

DETAILED DESCRIPTION

Figure 1:
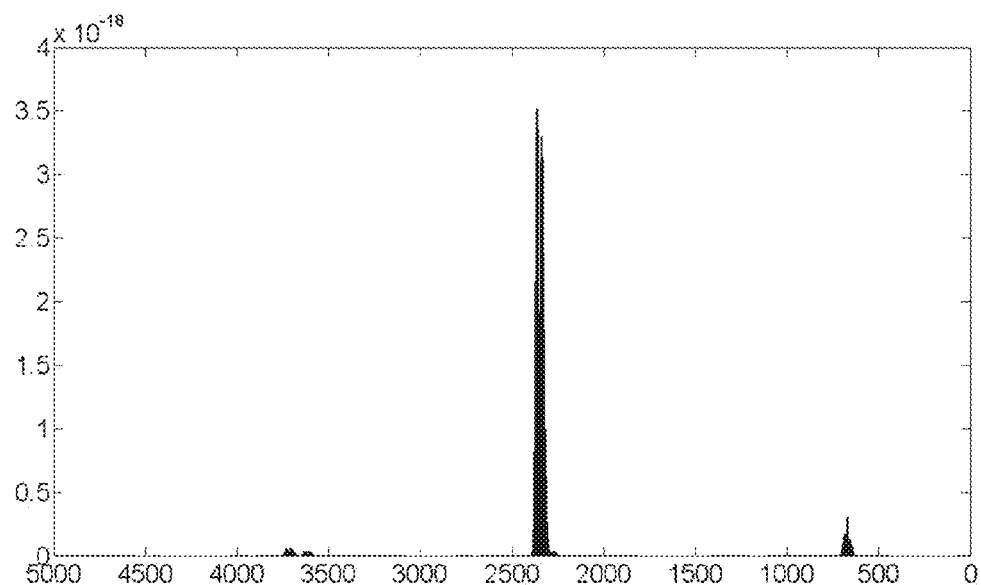
FIG. 1. Absorption spectrum of $CO_2$ near 2350 $cm^{-1}$.
Figure 2:
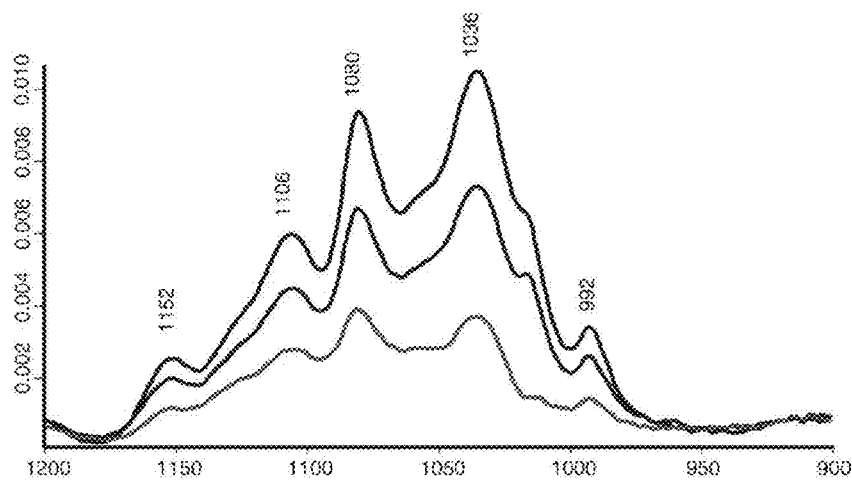
FIG. 2. Absorption spectrum of glucose.
Figure 3:
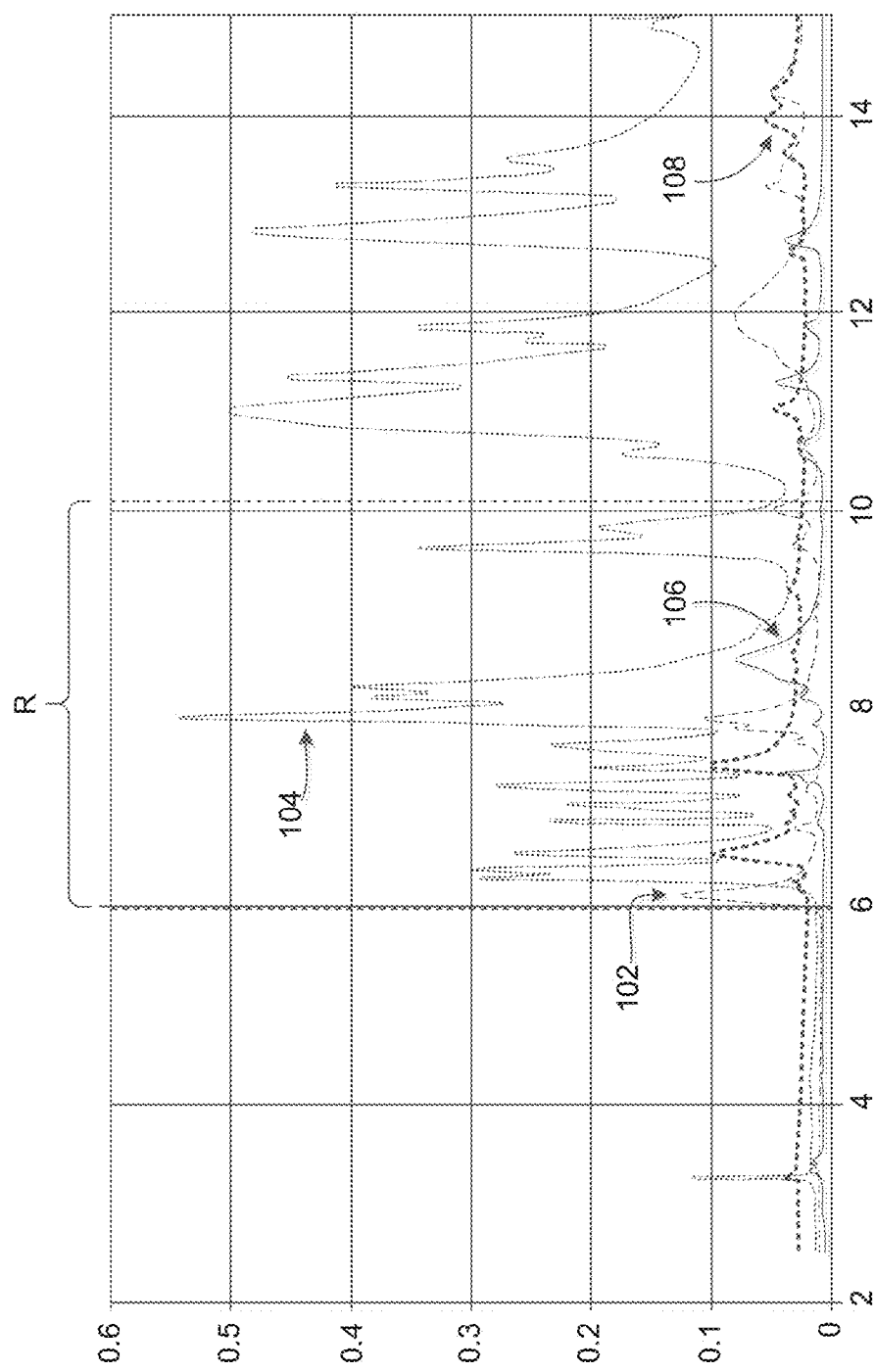
FIG. 3. Absorption spectrum of several common explosives.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known embodiments. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise.

As used herein, a "superlattice" comprises at least two semiconductor materials with different bandgaps that produce quantum well confinement and interband or typically generally intersubband transitions (see, e.g., U.S. application Ser. No. 13/661,559, herein incorporated by reference in its entirety). The thicknesses of the at least two semiconductor materials may change within lattice or may be of constant thickness. If the thicknesses of the materials change, they may change in a linear or nonlinear fashion.

As used herein, a "stage" comprises a series of quantum wells formed by the superlattice that allow electrons to transition from an injector region to an active section, with the active section structured to induce lasing via one or more interband or intersubband transitions. A particular stage structure generally lases within a quite limited wavelength range. A stack comprises multiple stages arranged in a stacked configuration. As used herein, "heterogeneous quantum cascade" comprises multiple stacks wherein the stages from different stacks are not identical, that is, wherein there are at least two different stage structures each inducing lasing at differing center frequencies. The "active region" or "core" is comprised of at least one stack and is used to describe the region of the laser that produces the light emission.

Figure 4:
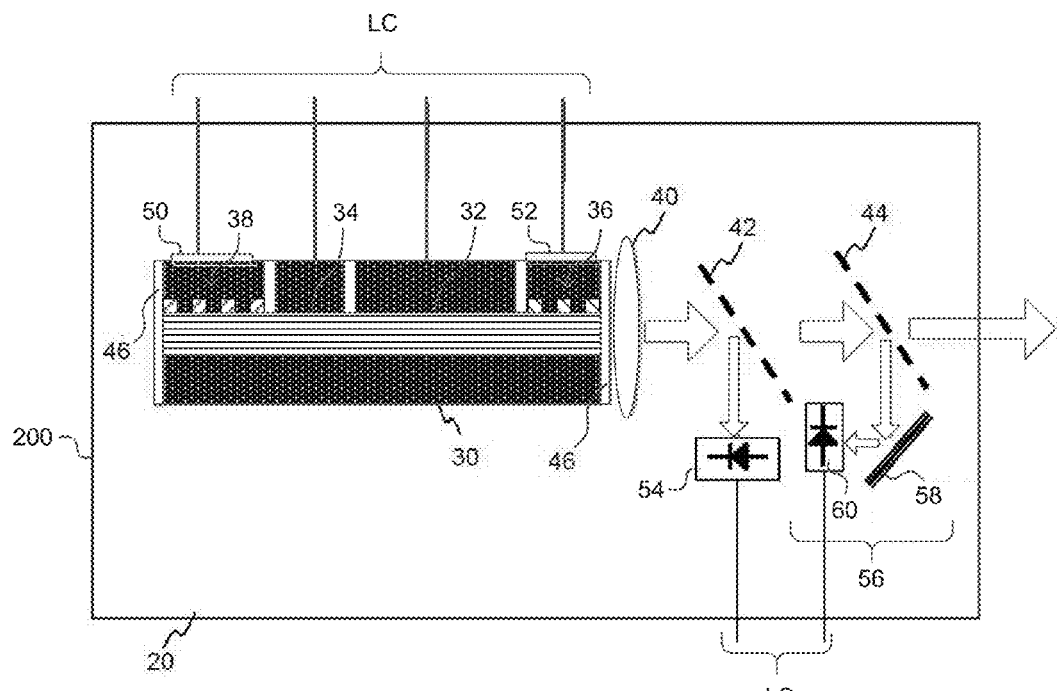
FIG. 4. An embodiment comprising a mid-IR QCL with an active core made of heterogeneous cascaded stages with integrated grating-based tuning capability, power and wavelength monitoring.

An embodiment, shown schematically in FIG. 4, comprises a monolithic tunable mid-IR laser source 20 covering a very wide and very useful mid-IR wavelength range, preferably with a width normalized to the center wavelength of at least 10%, more desirably at least 30% and even 50% and covering wavelength well-positioned in the region from about 3 μm to about 14 μm for detecting large molecules of interest (positioned for example according to one alternative embodiment at 6-10 μm). A core or gain region 32 of a laser chip 30 comprises one or more stacks of heterogeneous cascaded stages (described below) integrated on the same chip 30 with an optional phase control region 34 and at least one, desirably two grating structures 36, 38, desirably but not necessarily at opposing ends of the laser. (In the laser shown, the gratings are at opposing ends, with grating 36 being positioned as a front grating and grating 38 as a back grating.) Desirably, there are at least two different stack designs (described below) with different center wavelengths, or desirably for even broader wavelength tuning, three or more.

The gratings 36, 38 may desirably be sampled gratings or interleaved sampled gratings, or most desirably, the gratings are superstructure gratings. Desirably, the two gratings each have a comb-structure reflective function, but with mutually differing comb spacing, optimized to operated together for using Vernier tuning. A microheater 50 is desirably provided, or alternatively direct injection electrode 52 or a combination of these, for tuning each grating independently. Further, the grating tuning is desirably controlled by an external controller (or optionally, a package-internal controller (not shown)) for both gratings simultaneously, to produce continuity of tunability throughout the tuning range (to produce a tuning range having no gaps, that is, no unaddressable wavelengths). For embodiments to have such continuity of tunability, it is desirable that the two integrated distributed feedback gratings are each independently tunable through a range at least equal to larger of the two comb spacings.

Figure 5:
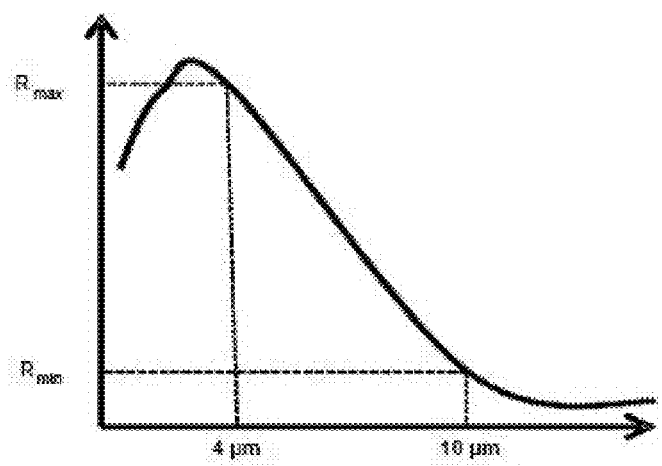
FIG. 5. Desirable optical filter function of the reflective or transmissive filter of the wavelength discriminator of the embodiment of FIG. 4.

The laser 20 desirably has a package enclosure 200 or substrate including therein or thereon power and wavelength monitoring devices. In the embodiment shown in FIG. 4, a lens 40 passes and collimates or focuses the radiation leaving the laser chip 30, represented by the horizontal arrows. Two low-reflectivity partially reflective mirrors 42, 44, redirect a portion of the radiation represented by the downward arrows onto a power sensor such as a photodiode 54 and a wavelength discriminator 56, here in the form of a wavelength selective reflector 58, and a second power sensor such as a second photodiode 60. The reflector 58 may be designed or selected so as to have a filter function like that shown in FIG. 5, for example, with an ever-decreasing (or alternatively ever-increasing) R (from Rmin to Rmax) through the wavelength range of interest. The output of the first photodiode gives a read of the power out of the laser, while comparison of the two levels of detected power then allows for a simple and direct detection of wavelength. Broadband antireflection coatings 46 are desirably provided at the ends of the monolithic laser chip 30 as shown in FIG. 4 to suppress Fabry-Perot modes. Leads for sensing LS and for control LC desirably lead outside the package 200 for use with external sensing, power, and control circuitry, which isolates control circuits from the heat produced in the device. Active thermoelectric cooling (not shown) is desirably applied within the package.

Figure 6:
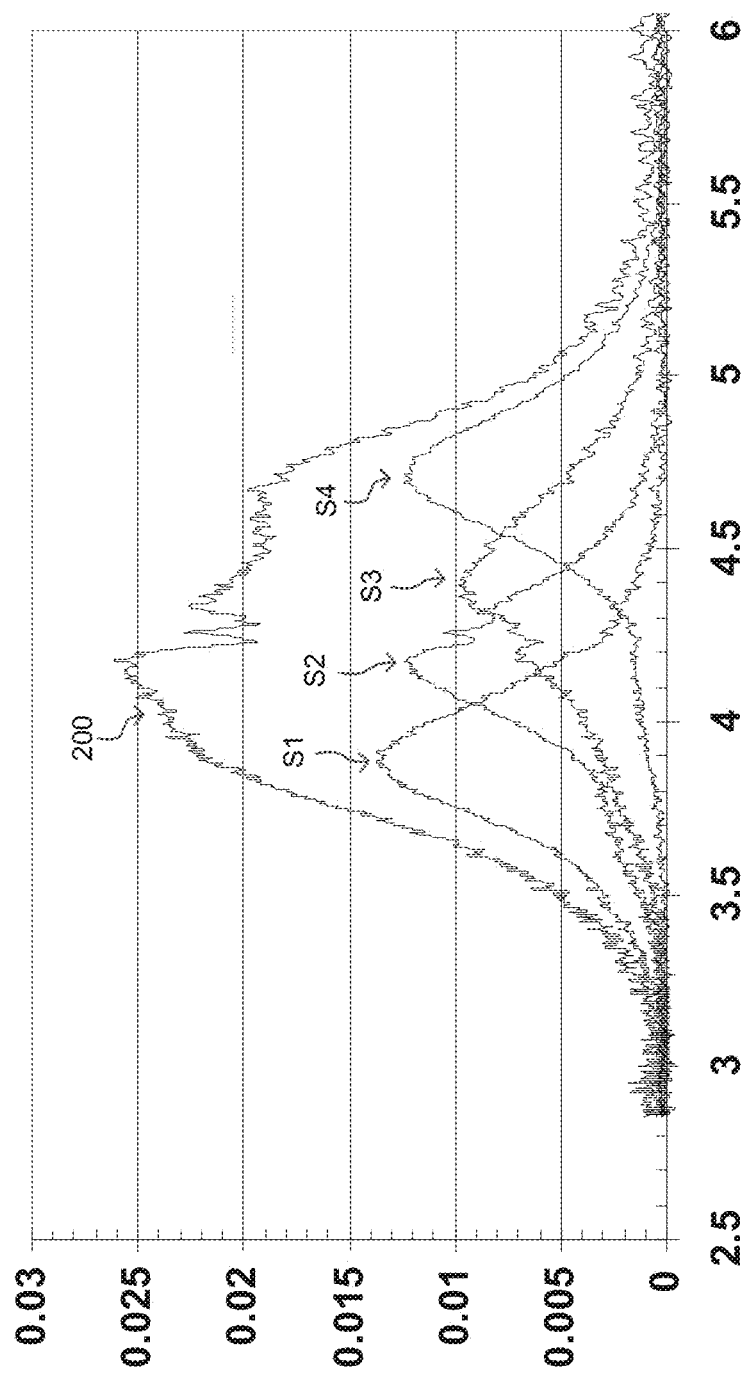
FIG. 6. Example amplification spontaneous spectrum of heterogeneous cascaded stacks with four different stack designs having four different wavelength peaks/center wavelengths.
Figure 7:
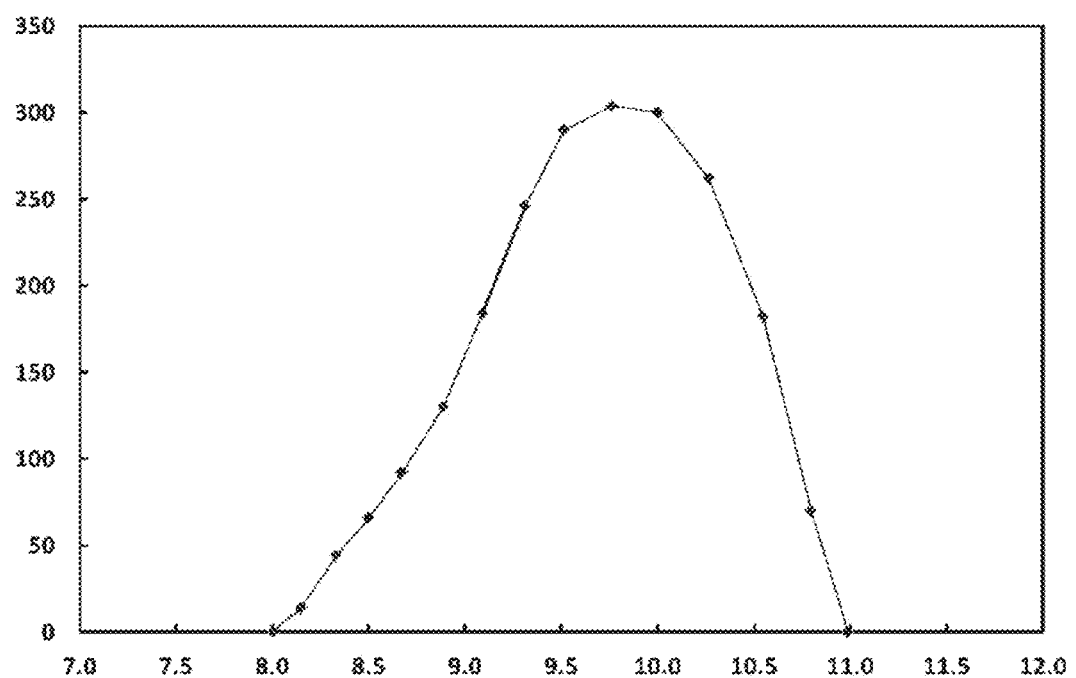
FIG. 7. Example pulsed lasing wavelength dependent peak power of a grating tuned external cavity laser incorporating a long wavelength broad gain chip made of heterogeneous cascaded stacks with two different stack designs having two different wavelength peaks/center wavelengths.

As mentioned above, the broad gain core comprises one or more stacks of multiple stages having heterogeneous structures or designs, with each stage designed for amplification/emission of a specific center wavelength and wavelengths surrounding that. Desirably there are at least two or three, or even more than three—different peak gain wavelengths provided by the respective different stacks. The different peaks effectively combine to create a broad range of optical gain. In FIG. 6, for example, is shown the amplified spontaneous emission in arbitrary units as a function of wavelength in micrometers (for a grating tuned external cavity laser incorporating this QCL chip, lasing in the wavelength range of about 3.8 to 4.8 µm covering a range of about a 22.3% of the center wavelength in the example of FIG. 6. The wavelength peaks of the various stacks, labeled S1-S4 in FIG. 6, combine for a total gain curve T. (The power dip near the center wavelength is from $CO_2$ absorption, as this example is broad gain core that was tested in an external cavity laser.) An experimental lasing result produced from a longer-wavelength core with stacks having only two different peak gain wavelengths is shown in FIG. 7 (this time of peak power in milliwatts as a function of wavelength in micrometers, providing a wavelength range extending from just above 8 µm to just below 11 µm, for a wavenumber range of about 350 $cm^{-1}$ (31.6% of the center wavelength) and showing the promise of the approach, although more different peak wavelengths and a wider tuning range is envisioned for the most preferred present embodiments).

Figure 8:
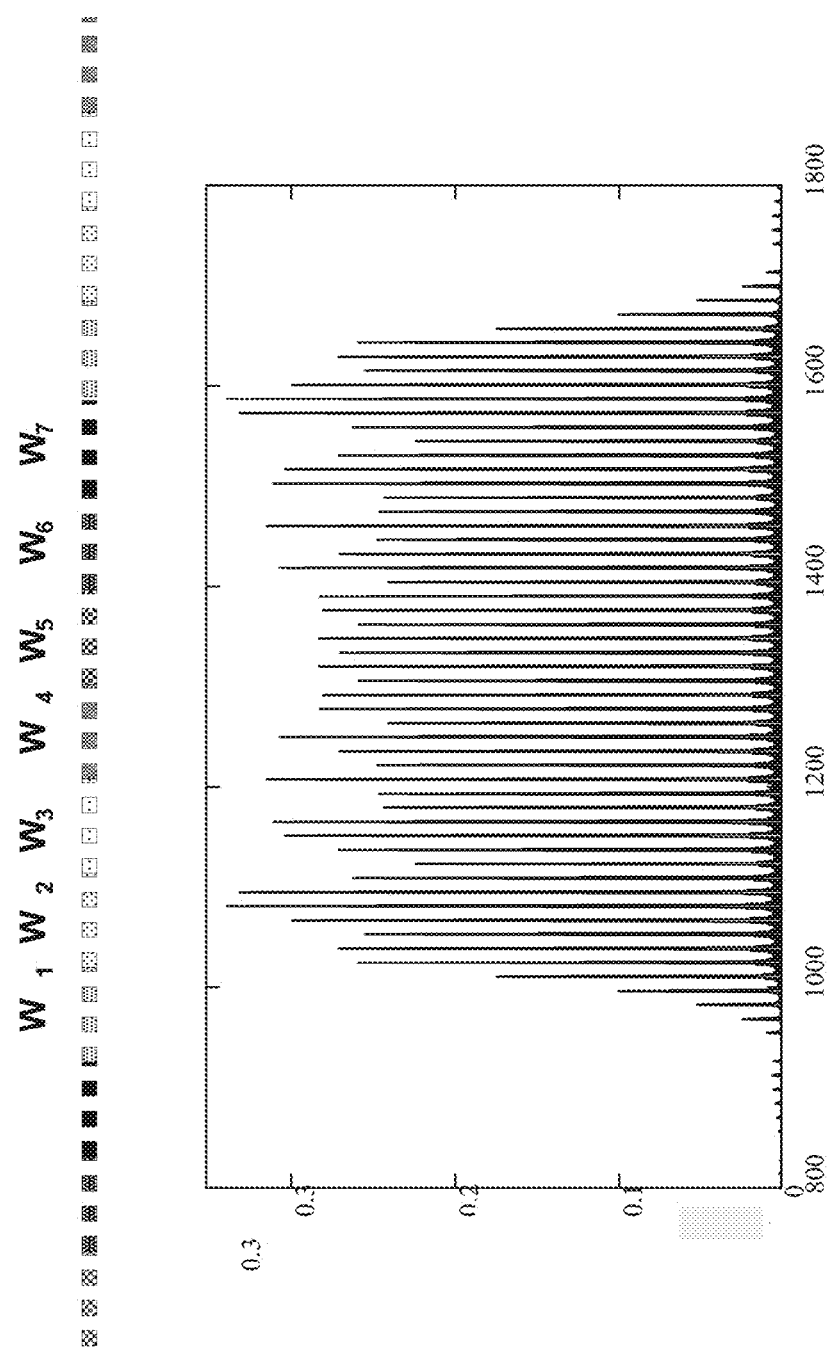
FIG. 8. A representation of a portion of the structure of a super-structure grating (SSG) made of seven interleaved sampled gratings at the top of the figure, together with the calculated reflectance spectrum of the grating, which has a comb spacing of 14 cm$^{-1}$.

As mentioned above, in embodiments intended, as presently preferred, for Vernier tuning, paired superstructure gratings are the most desirable, and comprise front and rear gratings having periodic comb reflective functions with slightly different periods. An exemplary superstructure grating design is shown at the top of FIG. 8, having seven different sampled gratings interleaved, with the calculated reflectance response curve shown in the graph below. The resulting reflectance curve is a comb extending from around 1000 $cm^{-1}$ to around 1667 $cm^{-1}$, or from about 6 to 10 µm. The flatness is expected to be capable of even further improved through modeling and model-based adjustment of the design.

The principle of Vernier tuning is illustrated in FIGS. 9A and 9B. Two gratings have periodic reflectance combs as shown (represented by the solid black vertical bars, as a function of wavenumber on the horizontal axis). One grating having a slightly smaller comb spacing S than the other, and one slightly larger L, as indicated, are used together as the front and rear reflectors for the QCL laser of FIG. 4. As shown in FIG. 9A, heating (as by heaters or by current injection) the larger spacing grating pushes its reflectance comb L toward lower wavenumbers (represented by the shift of the reflectance bars of larger spacing grating leftward, indicated by the small arrow, to the position of the bars depicted in outline), generating alignment between the two gratings with successively higher wavenumber peaks of the smaller comb, and causing tuning toward increasing wavenumbers, as illustrated by the shift from alignment A1 to alignment A2. As similarly shown in FIG. 9B, heating the small spacing grating pushes its reflectance comb S toward lower wavenumbers, generating alignment with successively lower wavenumber peaks of the larger comb, and causing tuning toward decreasing wavenumbers, as illustrated by the shift from alignment A3 to alignment A4. Tuning in the space between the successive alignments, when tuning either upward or downward, is addressed by heating both gratings in coordination to shift into the exact wavenumber (wavelength) desired. If the two gratings are each independently tunable through a range at least equal to larger of the two comb spacings S and L, every frequency within the outer bounds of the tuning range should be tunable.

Figure 10A:
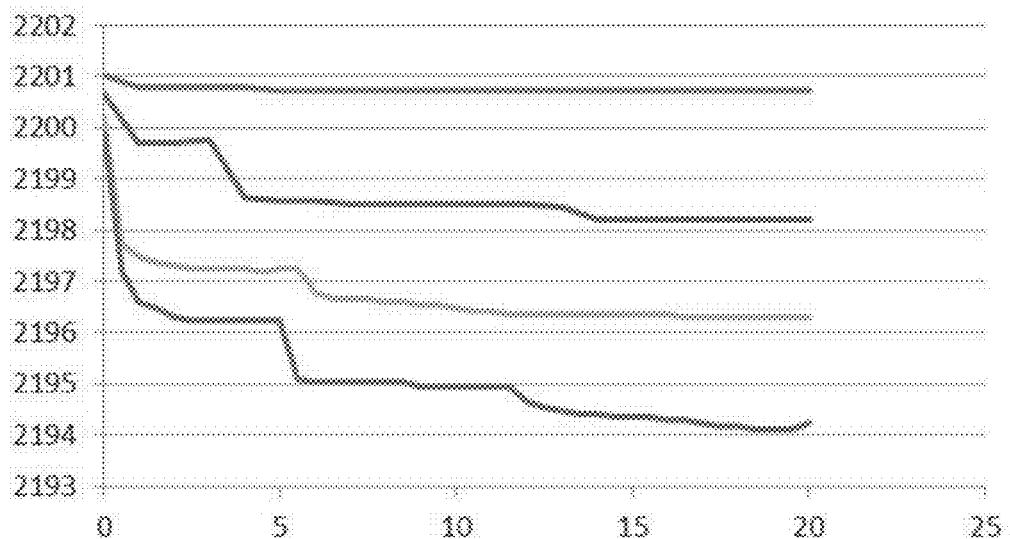
FIGS. 10A and 10B. Time-resolved tuning effects results obtained with direct injection, with a current-on event shown in FIG. 10A and current-off in FIG. 10B.
Figure 10B:
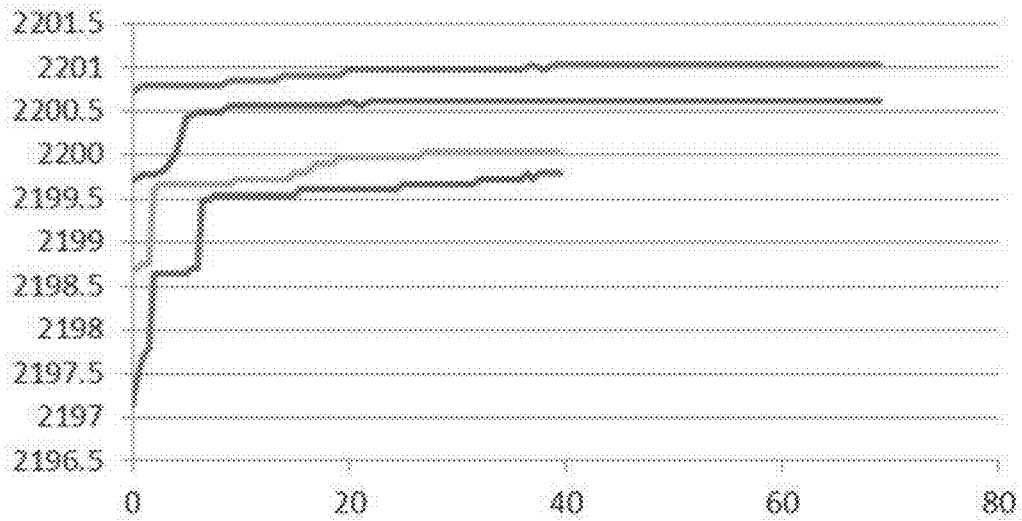
Figure 11A:
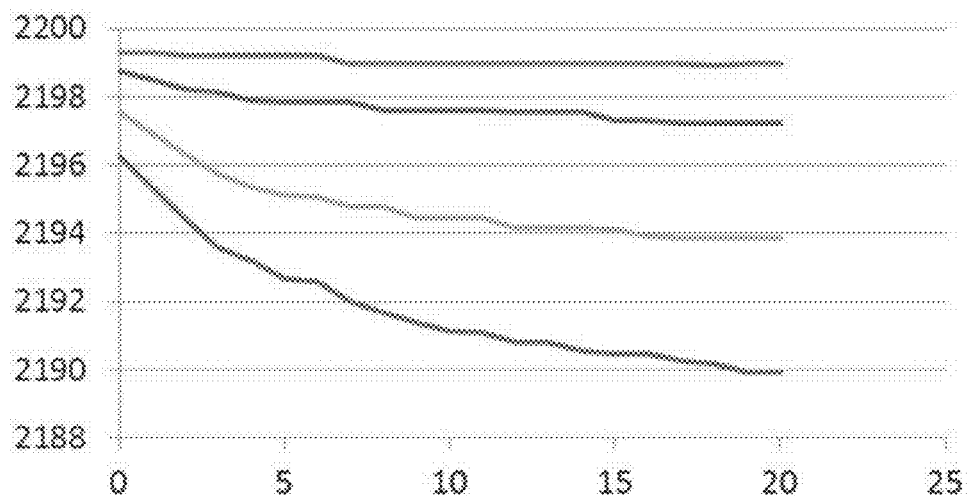
FIGS. 11A and 11B. Time-resolved tuning effects results obtained with a microheater, with a current-on event shown in FIG. 11A and current-off in FIG. 11B.
Figure 11B:
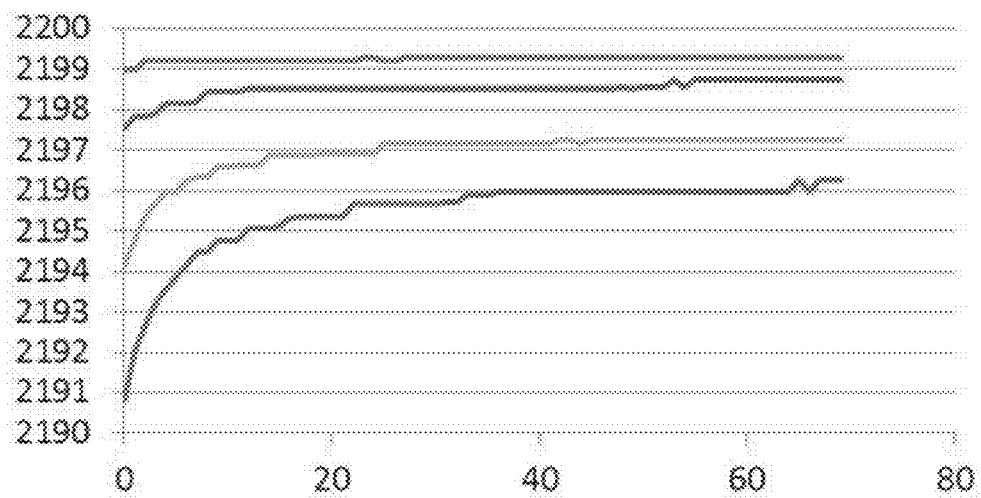

Tuning may desirably be achieved by either direct injection to the DBR gratings or by use of microheaters. FIGS. 10A and 10B show some results obtained with injection, with a current-on event shown in FIG. 10A and current-off in FIG. 10B the traces show wavenumber in $cm^{-1}$ as a function of time in microseconds. In each figure, the top trace is for a 50 mA current, with the next downward traces for 100 mA, 150 mA, and 180 mA, respectively. FIGS. 11A and 11B show the same tests and traces, but with a microheater-tuned DBR. As may be seen from the figures, response times are similar for the two approaches (and both are relatively fast). The microheater shows a lightly greater tuning range, and may potentially be desirable for that reason.

Figure 12:
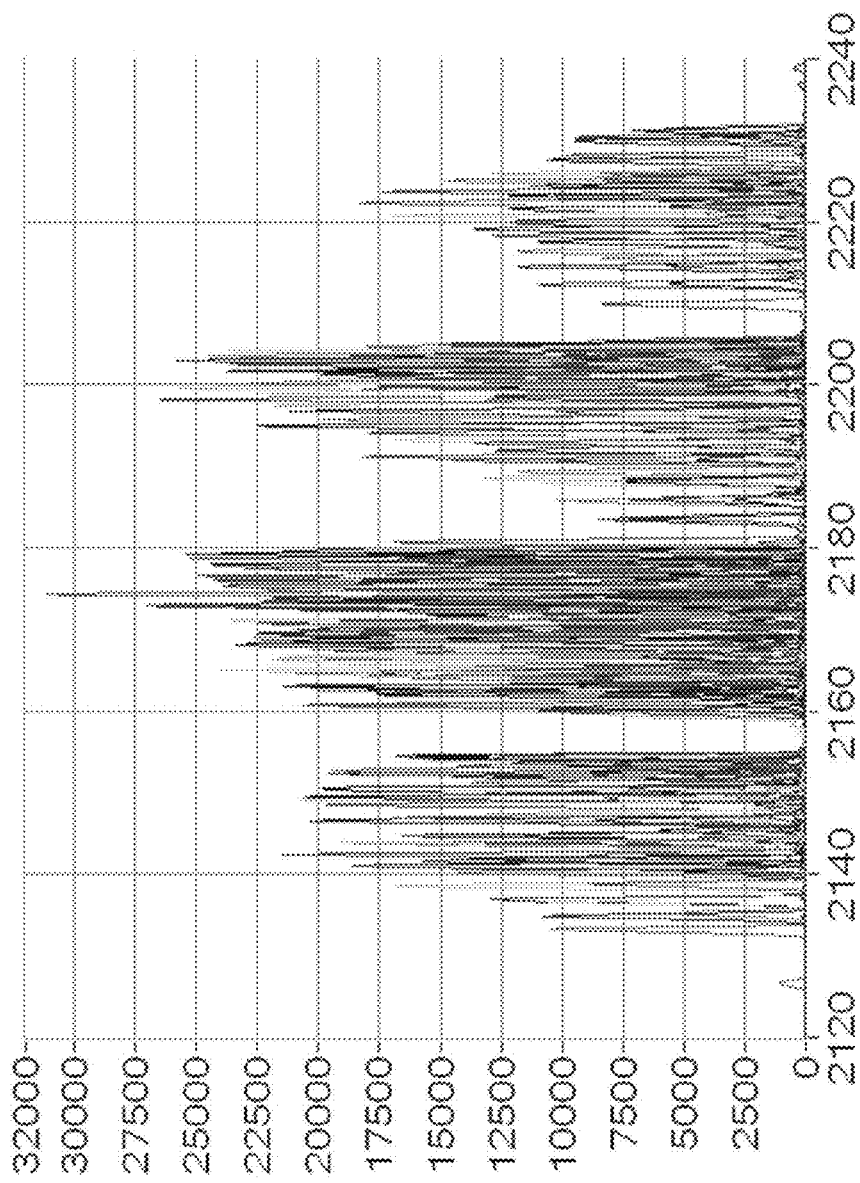
FIG. 12. The spectra of 225 (15×15) scans taken from a device similar to that of FIG. 4 by systematically and individually changing the DC current into the front and into the back gratings from 0 to 140 mA, respectively, at a 10 mA increment.

A method of characterizing a monolithic tunable mid-infrared laser such as that of FIG. 4, comprising a heterogeneous quantum cascade active region together with at least a first and desirably a second tunable integrated distributed feedback grating, desirably positioned at opposite ends of the laser from each other, may include operating the laser while tuning the first grating through its full tuning range, while holding the reflectivity function of the second grating constant, then operating the laser while tuning the second grating through its full tuning range, while holding the reflectivity function of the first grating constant, while detecting and mapping the wavelengths output by the laser. Results of such an experiment are shown in FIG. 12, which shows results for a sampled grating (SG) DBR QC laser in the form of the spectra of 225 (15×15) scans taken by systematically changing the DC current supplied into front and back SG (sampled-grating) DBR sections from 0 to 140 mA, respectively, with 10 mA increment. The experiment shows the wide tunability available through the Venier tuning technique, although the grating performance is not too uniform across the spectrum. Superstructure gratings are generally more desirable for improved performance, and would be preferred as an alternative to even out the spectrum.

One beneficial method of operating a monolithic tunable mid-infrared laser such as that of FIG. 4 may also be understood in conjunction with FIG. 12. Rather than relying on a predictive characterization of the laser to command and control the output wavelength, the laser may simply be run through various frequencies within its range, whether in a sequential sweep or in a more complex pattern. For example, the pattern produced by the tuning shown in FIG. 12, repeated with slight variation, could rapidly cover all of the addressable wavelength range with relatively high resolution. Detection of a wavelength dependent response can then proceed in parallel with detection of the wavelength producing the response, such that tight predictive control of the wavelengths produced is not required, potential easing control system requirements significantly.

The present devices may also use a method of calibrating by detecting at least one absorption line of $CO_2$ in air, or by detecting absorption lines of other dominant gases in air, or by detecting at least one absorption line of a reference gas sample contained within the package enclosure.

Methods of manufacturing may comprise using fabrication processes similar to those traditionally used in DFB QCLs. Embodiments herein are advantageous in that they can functionally replace tunable EC QCLs with a device having smaller size, faster speed and lower cost. Further, embodiments also have size and cost advantages over DFB QCL arrays, since DFB QCL arrays typically need combining optics to optically combine the output of an array into one optical beam.

Embodiments may comprise a gain material comprising at least two, compositionally non-identical, layers forming a superlattice. By proper design of the layer thicknesses, it is possible to engineer a population inversion between two sub-bands in the system which is necessary to achieve laser emission. The thickness of the layers may be identical or may be different depending on the desired design. In some embodiments, the layers have a thickness from about 1 Å to about 500 Å. In some embodiments, the layers have a thickness from about 10 Å to about 100 Å. In some embodiments, the layers have a thickness of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60, 70, 80, 90, 100, 125, 150, 175, 200, 250, 300, 350, 400, 450, or 500 Å.

Materials that may be used to form the layers in the gain material generally comprise semiconductors, such as group IV, III-V, and II-VI semiconductors. In some embodiments, the layers may comprise GaAs, $Al_xGa_{1-x}As$, $Si_xGe_{1-x}$, or $Ga_xIn_{1-x}As$ and $Al_yIn_{1-y}As$, wherein x and y are from 0 to 1.

The superlattice gain material may be produced using various techniques, for example molecular-beam epitaxy (MBE) (including gas-source MBE and MO-MBE), metalorganic vapor phase epitaxy (MOVPE), or sputtering. These methods allow production of layers with thicknesses of only a few atomic spacings.

Embodiments may further comprise an optical waveguide. An optical waveguide, as used herein, comprises a physical structure that guides electromagnetic waves in the optical spectrum. While not limited to any specific type of waveguide, one type of optical waveguide commonly used is a ridge waveguide. A ridge waveguide is created by etching parallel trenches in the quantum cascade gain material to create an isolated stripe of QC material, typically, but not necessarily, about 4-15 µm wide and several mm long (the length is usually defined by cleaving). Lateral mode confinement may be achieved by the deposition in the trenches of a dielectric material, and then the entire ridge is typically coated with gold to provide electrical contact and to help remove heat from the ridge when it is producing light. More commonly, lateral mode confinement is achieved by growing in the trenches a semi-insulating material such as InP if the laser was grown on InP substrate. Light is emitted from the cleaved ends of the waveguide.

Embodiments may further comprise an antireflection or antireflective (AR) layer. As used herein an AR layer comprises an optical coating applied to at least one end (facet) of the device and that reduces reflection, particularly in the IR region. The AR layers may be of any type, such as index-matching, single layer interference, multi-layer interference, or moth eye (nanostructured). In some embodiments, the AR coatings provide less than about 10%, 5%, 4%, 3%, 2%, 1%, 0.5%, 0.1%, 0.01%, 0.001%, or 0% loss.

Gratings can be patterned by electron beam ("e-beam") writing, contact printing of a grating mask, manufactured by e-beam lithography, or holography.

Additional components that may be found in embodiments comprise n-type cladding layers both above and/or below the gain material. The active gain and wavelength selective sections may be capped with a patterned electrical contact layer which comprises respective control electrodes dedicated to the different laser sections. An insulating dielectric material may be deposited in appropriate regions in the patterned electrical contact layer to isolate electrically the distinct regions of the laser structure.

In typical embodiments, the lasing sections are separated by a p-type electrical isolation region, as described in U.S. application Ser. No. 13/050,026, incorporated by reference herein in its entirety. For example, an active waveguide core may be sandwiched between upper and lower n-type cladding layers. The active core and the lower n-type cladding layer, as well as at least part of the upper cladding layer, extend through the electrically isolated laser sections of the embodiment. A portion or portions of the upper n-type cladding layer comprise sufficient p-type dopant to define p-type electrical isolation region(s), which extend across part of the thickness of the upper n-type cladding layer along a projection separating the sections of the embodiment. The upper and lower n-type cladding layers may comprise InP, GaAs, AlGaAs, or any other conventional or yet-to-be developed cladding material suitable. For example, and not by way of limitation, it is contemplated that a variety of cladding materials might be suitable, including II-VI semiconductors, Si—Ge or GaN-based materials, etc.

There are diverse ways of realizing the p-type isolation regions. Among these are selective growth, ion implantation, and diffusion of a p-type dopant. If the last option is chosen, the respective compositions of the upper and lower n-type cladding layers and the gain material may be selected to facilitate formation of the p-type electrical isolation regions by dopant diffusion. More specifically, the upper and lower n-type cladding layers may comprise InP and the p-type dopant may be selected such that its maximum stable concentration in the InP upper n-type cladding layer is below approximately $n \times 10^{18}$ cm$^{-3}$, where n is less than 3.

An alternative method of isolating the lasing sections comprises removal of the highly doped part of the n-cladding layer.

By way of example, and not limitation, it is alternatively contemplated that the upper and lower n-type cladding layers may be GaAs-based cladding layers. Some of the cladding layers may be AlGaAs or (Al)GaInP instead of simply GaAs or InP. For GaAs-based cladding layers, the core may be GaAs/AlGaAs, AlGaAs/AlGaAs, (Al)GaInP/(Al)GaInP, or GaInAs/(Al)GaAs. Additional layers of similar composition are contemplated for the remaining layers of the structure and should be selected to compensate for any lattice-mismatch between GaInAs and the GaAs substrate. For example, and not by way of limitation, other possible layers are GaInP, AlGaInP, GaAsP, and GaInAsP. For GaAs-based cladding layers, suitable dopants used to make (Al)GaAs semi-insulating include, but are not limited to Cr and O. At very low temperature growth, semi-insulating (Al)GaAs can be obtained without any dopant.

Embodiments herein are desirably used in a pulsed mode, but continuous-wave mode may be useful in some applications. Laser pulse duration may be from about 1 ns to about 1 ms. In some embodiments, the pulse width at FWHM is about 1 ns, 2 ns, 3 ns, 4 ns, 5 ns, 6 ns, 7 ns, 8 ns, 9 ns, 10 ns, 20 ns, 50 ns, 60 ns, 70 ns, 80 ns, 90 ns, 100 ns, 200 ns, 300 ns, 400 ns, 500 ns, 600 ns, 700 ns, 800 ns, 900 ns, 1 µs, 10 µs, 100 µs, or 1 ms. In some embodiments, devices embodied herein may be designed to fire all laser sections simultaneously, individually, and/or in a sequential or programmed order.

Embodiments may be used in any number of methods wherein IR radiation, and particular IR laser radiation would be advantageous. Particular applications include IR absorbance or reflectance measurements, IR and FTIR spectroscopies, Raman spectroscopy, gas and/or chemical weapons detection, chemical dynamics and kinetics measurements, thermal experiments, etc. In one embodiment, the embodiments are used in IR absorbance measurements to identify molecular compositions.

What is claimed is:

1. A monolithic tunable mid-infrared laser having a wavelength within the range of 3-14 µm comprising:
    a heterogeneous quantum cascade active region together with at least a first integrated distributed feedback grating; and
    a package enclosure containing the heterogeneous quantum cascade active region and at least the first integrated distributed feedback grating;
    wherein
    the Bragg wavelength of the first integrated distributed feedback grating is tunable;
    the package enclosure further contains a wavelength monitoring device for monitoring the wavelength output from the laser;
    wherein the wavelength monitoring device comprises:
        a first power monitor; and
        a wavelength discriminator, the wavelength discriminator comprises a second power monitor and a transmissive or reflective wavelength-selective filter with an ever-increasing or ever-decreasing filter function over a tunable wavelength range.

2. The laser according to claim 1 wherein the heterogeneous quantum cascade active region comprises at least two stacks, each stack comprising differing stages.

3. The laser according to claim 1 wherein the heterogeneous quantum cascade active region comprises at least three stacks, each stack comprising differing stages.

4. The laser according to claim 1 wherein the Bragg wavelength of the first distributed feedback grating is thermally tuned by a microheater.

5. The laser according to claim 1 wherein the first distributed feedback grating is supplied with a contact for current injection into the first distributed feedback grating.

6. The laser according to claim 1 wherein the laser further comprises a second tunable integrated distributed feedback grating independently tunable from the first grating, and wherein the first and second gratings are comb gratings and have respective non-identical first and second comb spacings.

7. The laser according to claim 6 wherein the first and second integrated distributed feedback gratings are each independently tunable through a range at least equal to a larger spacing of the respective first and second comb spacings.

8. The laser according to claim 1 wherein at least the first integrated distributed feedback grating comprises a sampled grating.

9. The laser according to claim 1 wherein at least the first integrated distributed feedback grating comprises an interleaved sampled grating.

10. The laser according to claim 1 wherein at least the first integrated distributed feedback grating comprises a superstructure grating.

11. The laser according to claim 1 having a tunable output range of at least 10% of the center wavelength.

12. The laser according to claim 1 having a tunable output range of at least 20% of the center wavelength.

13. The laser according to claim 1 having a tunable output range of at least 30% of the center wavelength.

14. The laser according to claim 1 having a tunable output range of at least 40% of the center wavelength.

15. The laser according to claim 1 having a tunable output range of at least 50% of the center wavelength.

16. The laser according to claim 1 having a tunable wavelength range of at least 6 to 10 µm.

17. The laser according to claim 1 having a tunable wavelength range of at least 8 to 11 µm.

18. The laser according to claim 1 having a tunable wavelength range of at least 3.7 to 4.7 µm.

19. The laser according to claim 1 having a tunable wavelength range of at least 5 to 8 µm.

20. The laser according to claim 1 further comprising facets having broadband anti-reflection coatings to suppress Fabry-Perot lasing modes.

* * * * *